US010319599B2

United States Patent
Schulze et al.

(10) Patent No.: US 10,319,599 B2
(45) Date of Patent: Jun. 11, 2019

(54) METHODS OF PLANARIZING SiC SURFACES

(71) Applicant: Infineon Technologies AG, Neubiberg (DE)

(72) Inventors: Hans-Joachim Schulze, Taufkirchen (DE); Helmut Oefner, Zorneding (DE); Roland Rupp, Lauf (DE)

(73) Assignee: Infineon Technologies AG, Neubiberg (DE)

(*) Notice: Subject to any disclaimer, the term of this patent is extended or adjusted under 35 U.S.C. 154(b) by 41 days.

(21) Appl. No.: 15/609,438

(22) Filed: May 31, 2017

(65) Prior Publication Data

US 2018/0350612 A1   Dec. 6, 2018

(51) Int. Cl.
| | |
|---|---|
| *H01L 21/428* | (2006.01) |
| *H01L 21/321* | (2006.01) |
| *H01L 21/265* | (2006.01) |
| *H01L 21/3065* | (2006.01) |
| *H01L 21/02* | (2006.01) |
| *H01L 21/67* | (2006.01) |
| *H01L 29/16* | (2006.01) |
| *B05D 3/04* | (2006.01) |
| *C30B 25/18* | (2006.01) |
| *C30B 33/12* | (2006.01) |

(Continued)

(52) U.S. Cl.
CPC .......... *H01L 21/3065* (2013.01); *B05D 3/044* (2013.01); *C30B 25/186* (2013.01); *C30B 31/22* (2013.01); *C30B 33/12* (2013.01); *H01L 21/02074* (2013.01); *H01L 21/02433* (2013.01); *H01L 21/02658* (2013.01); *H01L 21/265* (2013.01); *H01L 21/32115* (2013.01); *H01L 21/425* (2013.01); *H01L 21/67075* (2013.01); *H01L 29/16* (2013.01)

(58) Field of Classification Search
None
See application file for complete search history.

(56) References Cited

U.S. PATENT DOCUMENTS

| | | | |
|---|---|---|---|
| 8,187,958 B2 * | 5/2012 | Shibagaki | H01L 21/0445 438/522 |
| 2003/0062335 A1 * | 4/2003 | Brewer | B24B 7/241 216/38 |

(Continued)

FOREIGN PATENT DOCUMENTS

JP   2010135552   * 6/2010

OTHER PUBLICATIONS

Guillemin, Sophie et al., "InvestigaUon on Wet Etching 4H—SiC Damaged by Ion Implantation", Materiais Science Forum, May 2017, Trans Tech Publications.

*Primary Examiner* — Stephanie P Duclair
(74) *Attorney, Agent, or Firm* — Murphy, Bilak & Homiller, PLLC

(57) ABSTRACT

A method of planarizing a roughened surface of a SiC substrate includes: forming a sacrificial material on the roughened surface of the SiC substrate, the sacrificial material having a density between 35% and 120% of the density of the SiC substrate; implanting ions through the sacrificial material and into the roughened surface of the SiC substrate to form an amorphous region in the SiC substrate; and removing the sacrificial material and the amorphous region of the SiC substrate by wet etching.

21 Claims, 11 Drawing Sheets

(51) Int. Cl.
    *C30B 31/22*     (2006.01)
    *H01L 21/425*     (2006.01)

(56) References Cited

U.S. PATENT DOCUMENTS

2006/0267024 A1* 11/2006 Murphy ............ H01L 21/26506
    257/77
2015/0318174 A1* 11/2015 Sasaki ..................... C30B 29/36
    438/691

* cited by examiner

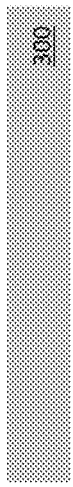
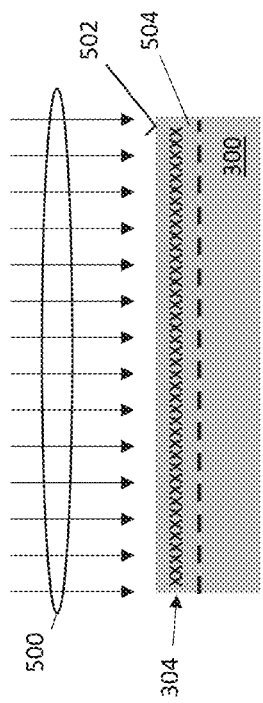

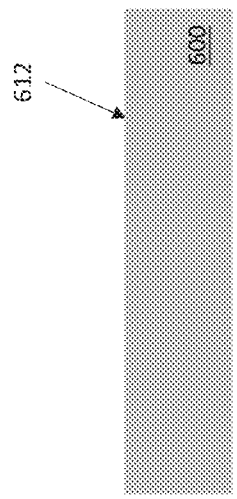
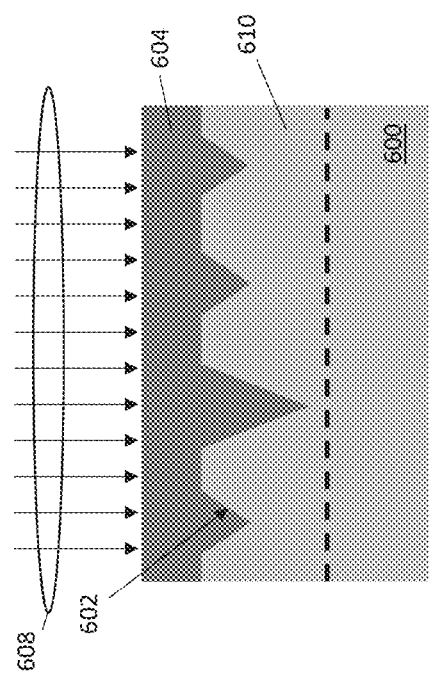

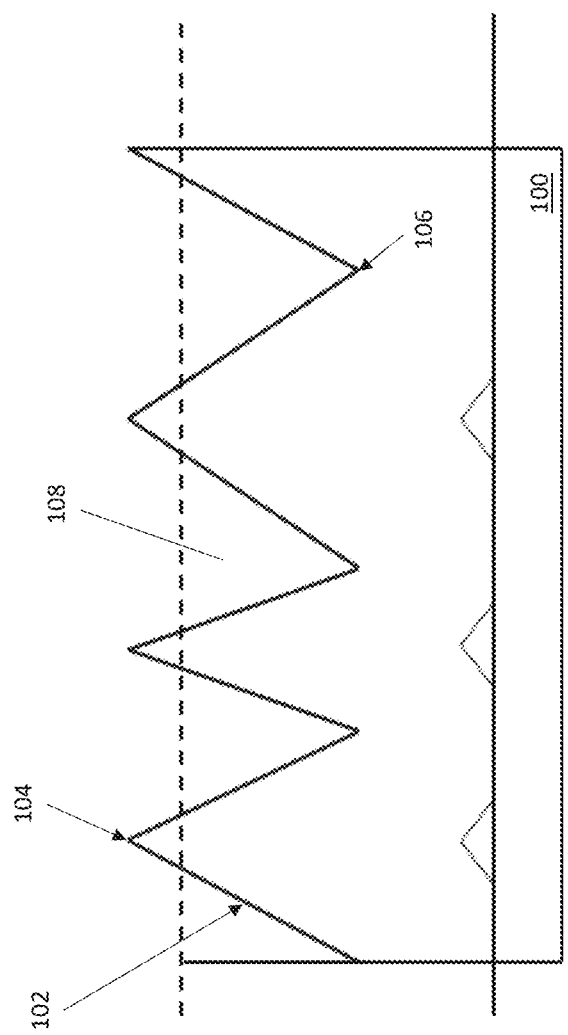

METHODS OF PLANARIZING SIC SURFACES

TECHNICAL FIELD

The present application relates to SiC substrates, in particular planarizing a roughened surface of a SiC substrate.

BACKGROUND

After mechanical separation of a SiC wafer from a SiC crystal, the surface of the SiC wafer has a high surface roughness which is not suitable for manufacturing electronic devices. Surface roughness is also a concern in SiC wafer reclaim processes that involve splitting/cleaving the SiC wafer instead of just grinding the wafer within the frame of a SiC thin wafer process. After the cleaving process, a surface roughness in the range of a few μm (e.g. between 1 and 5 μm average peak-to-valley distance) or greater (e.g. between 5 and 15 μm average peak-to-valley distance) can be expected. The roughened surface is typically polished to achieve the desired surface quality. Conventional approaches for planarizing the roughened surface of a SiC wafer after mechanical separation from a SiC crystal include performing a sequence of mechanical and chemical-mechanical polishing (CMP) steps until the final surface quality is reached. However, due to the very high hardness of SiC, which is comparable to diamond, this procedure is a difficult and high-cost process.

SUMMARY

Embodiments described herein provide cost-effective and less complex processes for planarizing the roughened surface of a SiC substrate.

According to an embodiment of a method of planarizing a roughened surface of a SiC substrate, the method comprises: forming a sacrificial material on the roughened surface of the SiC substrate, the sacrificial material having a density between 35% and 120% of the density of the SiC substrate; implanting ions through the sacrificial material and into the roughened surface of the SiC substrate to form an amorphous region in the SiC substrate; and removing the sacrificial material and the amorphous region of the SiC substrate by wet etching.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIGS. 5A and 5B illustrate an embodiment of a wet etching process for ensuring removal of a region of poor crystalline quality in the SiC substrate, after planarization of the roughened surface by wet chemical etching.

FIGS. 6A through 6E illustrate an embodiment of partly planarizing the roughened surface of the SiC substrate followed by full planarization of the roughened surface by wet chemical etching.

FIG. 8 illustrates yet another embodiment of at least partly planarizing the roughened surface of a SiC substrate.

DETAILED DESCRIPTION

The embodiments described herein provide effective processes for planarizing the roughened surface of a SiC substrate. The processes involve damaging the roughened surface of a SiC substrate so that the roughened surface becomes wet chemically etchable. The damaged region of the SiC substrate is then removed by wet chemical etching, which imparts significantly less stress on the SiC substrate as compared to conventional mechanical and CMP processing, costs less and provides a well-defined etch stop.

The roughened surface of a SiC substrate is damaged using an ion implantation process, wherein ions are implanted through a sacrificial material formed on the roughened surface. The sacrificial material is chosen to have a density between 35% and 120% of the density of the SiC substrate. This way, the ion stopping power of the sacrificial material is between 35% and 120% of the ion stopping power of the SIC substrate. As a result, the end-of-range of the ions implanted into the SiC substrate varies by at most +/−20%. If the density of the sacrificial material is chosen to be relatively close or even match the density of the SiC substrate, e.g. between 90% and 110%, between 95% and 105%, between 98% and 102%, etc. of the density of the SIC substrate, the end-of-range of the implanted ions will be generally uniform across the SiC substrate. The damaged part of the SiC substrate is removed by wet chemical etching to yield a substantially planar surface for subsequent device fabrication. The process can be repeated one or more times to yield a sufficiently planar surface.

FIGS. 1A through 1E illustrate an embodiment of a method of planarizing a roughened surface of a SiC substrate.

Figure 1B:
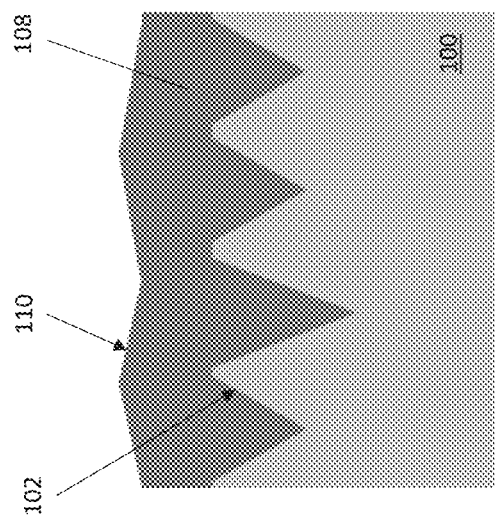
FIGS. 1A through 1E illustrate an embodiment of a method of planarizing a roughened surface of a SiC substrate by wet chemical etching.
Figure 1A:
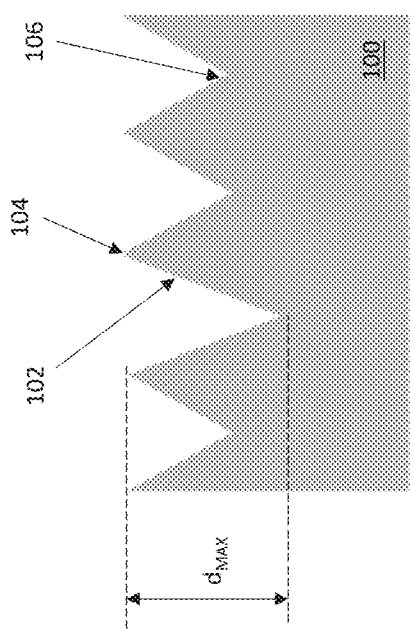

FIG. 1A shows part of a SiC substrate 100 having a roughened surface 102. The SiC substrate 100 preferably has a polymorph (polytype) suitable for electronic device fabrication such as but not limited to 2H—SiC, 4H—SiC or 6H—SiC. The SiC substrate 100 can be formed by splitting a SiC wafer, wherein the roughened surface 102 of the SiC substrate 100 results from the splitting process, by thinning a SiC wafer, wherein the roughened surface 102 of the SiC substrate 100 results from the thinning process, or by sawing a SiC boule, wherein the roughened surface 102 of the SiC substrate 100 results from the sawing process. The roughened surface 102 is comprised of numerous peaks 104 and valleys 106, and may have an average peak-to-valley distance between 1 and 5 μm, between 5 and 15 μm or even greater. The maximum peak-to-valley distance for the part of the substrate 100 illustrated in FIG. 1A is labelled $d_{MAX}$. The roughened surface 102 of the SiC substrate 100 requires planarization to be suitable for manufacturing electronic devices.

FIG. 1B shows the SiC substrate 100 after forming a sacrificial material 108 on the roughened surface 102 of the SiC substrate 100. The sacrificial material 108 has a density between 35% and 120% of the density of the SiC substrate 100. This way, the ion stopping power of the sacrificial material 108 is between 35% and 120% of the ion stopping power of the SiC substrate 108. The sacrificial material 108 provides nonconformal coverage of the roughened surface 102 of the SiC substrate 100, so that the valleys 104 between the peaks 106 of the roughened surface 102 are filled by the sacrificial material 108. Example compositions which can provide nonconformal coverage of the roughened surface 102 of the SiC substrate 100 and have a density between 35% and 120% of the density of SiC include but are not limited to: polymers, anti-reflective coatings, photoresists, spin-on-glass and a high-density-plasma chemical vapour deposited (HDP-CVD) oxides. The sacrificial material 108 can comprise one or more of these compositions or other compositions with similar density characteristics.

Figure 1C:
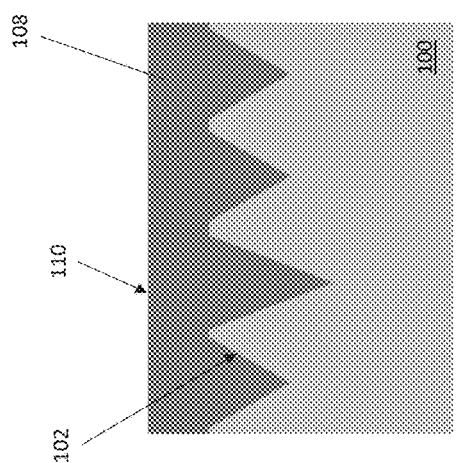

FIG. 1C shows the SiC substrate 100 after an optional planarization process. The topography of the sacrificial material 108 will be transferred to the underlying SiC substrate 100 during a subsequent ion implantation process shown in FIG. 1D. As such, if the (top) surface 110 of the sacrificial material 108 facing away from the SiC substrate 100 has a surface roughness greater than the final roughness target for the SiC substrate 100, an optional planarization process can be performed to shape the top surface 110 of the sacrificial material 108 with a desired planarity. Any standard planarization process can be used, such as but not limited to mechanical polishing, CMP, etc. The sacrificial material 108 has a lower hardness than SiC, and therefore can be easily planarized using any standard planarization process. Some sacrificial materials can be applied in a relatively planar manner so that the optional planarization process can be skipped. For example, spin-on-glass and other spin-on compositions can be applied in a relatively planar manner, depending on viscosity of the material.

Figure 1D:
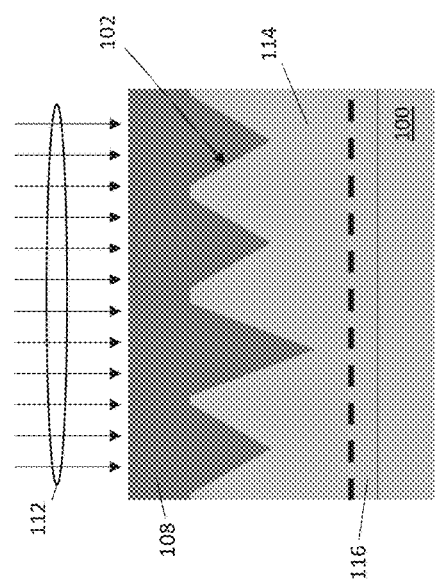

FIG. 1D shows ions 112 being implanted through the sacrificial material 108 and into the roughened surface 102 of the SiC substrate 100 to form an amorphized region 114. The desired ion implantation depth in the SiC substrate 100 is mainly determined by the topography of the outermost surface 110 of the sacrificial material 108 which is less rough than the roughened surface 102 of the SiC substrate 100. The ion implantation energy, which dictates the penetration depth, is chosen so that the SiC substrate 100 is amorphized in the range down to the dashed line in FIG. 1D, which indicates the bottom of the amorphous region formed by the ion implantation process. For example, the SiC substrate 100 may have an average peak-to-valley surface roughness of 2 microns (μm) with a variation between 1.5 and 2.5 μm. The ion implantation energy is chosen accordingly, e.g. to ensure an amorphous concentration of ions at the worst case/safety margin of 2.5 microns in the SiC substrate. In one embodiment, the sacrificial material 108 has an ion implant penetration depth (peak of implant distribution) at an ion energy of 1 MeV for phosphorous ions which is 150% higher or 100% higher or 50% higher than for SiC or 20% or 50% lower than for SiC. The maximum peak-to-valley value for the roughened surface of the SiC substrate 100 can be verified by a measurement process e.g. using any standard tool that can accurately calibrate the surface roughness of a SiC wafer, such as a stylus, to verify the ion implantation energy.

Below the dashed line in FIG. 1D the concentration of implanted ions is such that the SiC substrate 100 is not amorphized. The ions can be electrically active or inactive in the SiC substrate 100. In the case of an electrically active ion species, the region 116 of the SiC substrate 100 demarcated by the upper dashed line and the lower solid line in FIG. 1D becomes an electrically conductive region after annealing the SiC substrate 100 to activate the ions in this region. The conductivity type (p or n) of this region 116 depends on the type of ion species, and can form part of an electronic device to be subsequently manufactured from the SiC substrate 100. Examples of ion species suitable for causing amorphized damage in SiC include but are not limited to aluminum, argon, arsenic, nitrogen, oxygen, phosphorous, boron, silicon, carbon and germanium.

Figure 1E:
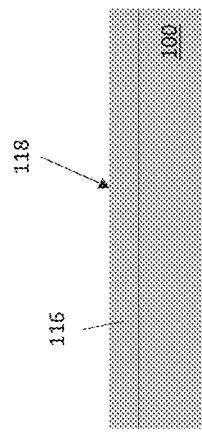

FIG. 1E shows the SiC substrate 100 after the sacrificial material 108 and the amorphous region 114 of the SiC substrate 100 are removed by wet etching, yielding a planarized top surface 118. Depending on the type of sacrificial material used, the sacrificial material 108 and the amorphous region 114 of the SiC substrate 100 can be removed by the same etching solution or by different etching solutions. The etch chemistry chosen for the sacrificial material 108 depends on the composition of the sacrificial material 108.

In one embodiment, the amorphous region 114 of the SiC substrate 100 is removed by etching the SiC substrate 100 in a solution of hydrofluoric acid, nitric acid, tetramethylammonium hydroxide or potassium hydroxide. The amorphous region 114 of the SiC substrate 100 can be removed by wet chemical etching whereas undamaged SiC cannot, which provides a clearly defined etch stop. The process illustrated in FIGS. 1A through 1E provides for the planarization of a very hard material (SiC) using a wet etching process which is less costly and easier to implement compared to conventional planarization techniques. As a specific non-limiting example, the SiC substrate 100 may have an average peak-to-valley surface roughness of about 0.5 μm which is covered by a spin-on coating of about 0.75 μm total thickness. Next, amorphizing atoms are implanted with a dose of more than 1E14 cm-2 or more than 3E14 cm-2 or even more than 5E14 cm-2 to a depth of about 1.5 μm in the SiC substrate 100 at an energy of about 1.5 MeV. The spin-on material is then removed with a standard wet etch process, and the SiC substrate 100 is wet chemically etched (e.g. at 0.15 μm/h) down to the end of range of the amorphized region 114.

Because the ion stopping power of the sacrificial material 108 is between 35% and 120% of the ion stopping power of the SiC substrate 100, and because the sacrificial material 108 is more planar than the roughened surface 102 of the SiC substrate 100, the bottom of the amorphous region 114 formed in the SiC substrate 100 by the ion implantation process illustrated in FIG. 1D is more planar than the roughened surface 102 of the SiC substrate 100. The degree of planarity at the bottom of the amorphous region 114 depends on the difference in ion stopping powers of the sacrificial material 108 and the SiC substrate 100. For example, at 20% ion stopping mismatch between the sacrificial material 108 and SiC, the surface roughness of the SiC substrate 100 is reduced to ⅕ of the original surface roughness after the first pass of the process illustrated in FIGS. 1A through 1E.

FIGS. 2A through 2D illustrate an embodiment in which the planarization process is repeated at least one additional time, e.g. if the first pass of the planarization process does not yield the desired final surface roughness.

Figure 2B:
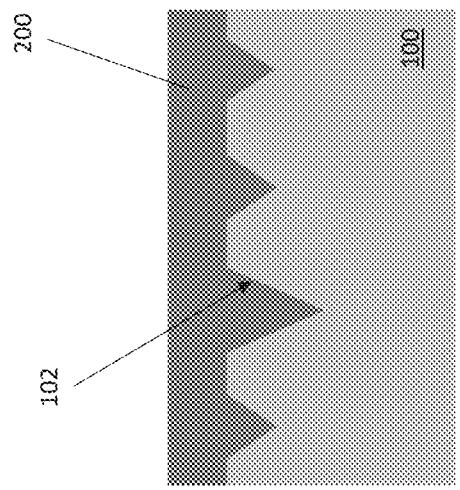
FIGS. 2A through 2D illustrate a second iteration of the planarization process.
Figure 2A:
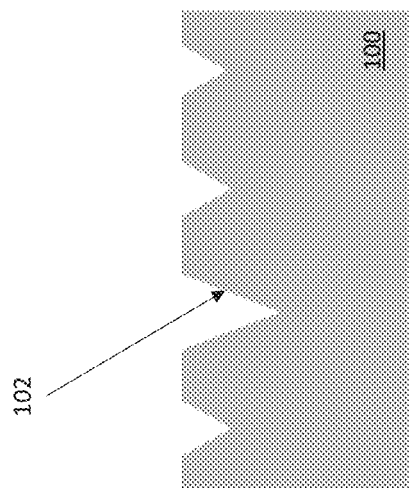

FIG. 2A shows the SiC substrate 100 after completion of the first pass of the planarization process. The SiC substrate 100 has remaining (undesired) surface roughness after the first sacrificial material 108 and the first amorphous region 114 of the SiC substrate 100 were removed by wet etching.

FIG. 2B shows the SiC substrate 100 after a new (additional) sacrificial material 200 is formed on the surface 102 of the SiC substrate 100 with the remaining roughness. The new sacrificial material 200 has a density between 35% and 120% of the density of the SiC substrate 100, and may be planarized as previously explained herein. For some types of compositions such as spin-on-glass and other spin-on materials, the optional planarization step can be skipped.

Figure 2D:
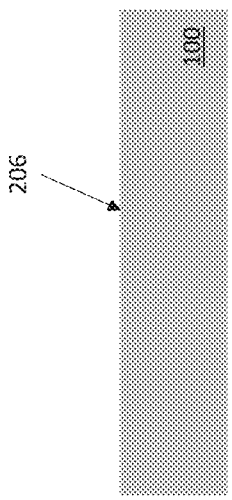
Figure 2C:
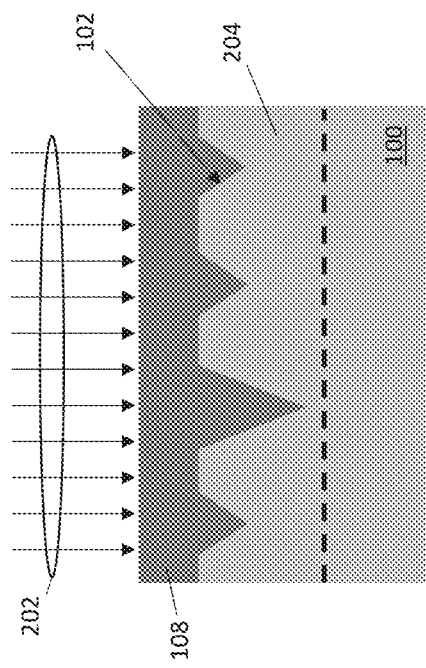

FIG. 2C shows the SiC substrate 100 as ions 202 are being implanted through the new sacrificial material 200 and into the surface 102 of the SiC substrate 100 with the remaining roughness to form a new (additional) amorphous region 204 in the SiC substrate 100. The dashed line in FIG. 2C indicates the bottom of the amorphous region 204.

FIG. 2D shows the SiC substrate 100 after the new sacrificial material 200 and the new amorphous region 204 of the SiC substrate 100 are removed by wet etching, yielding a planarized top surface 206. The new sacrificial material 200 and the new amorphous region 204 can be removed using the same or different etching solutions. The etch chemistry chosen for the new sacrificial material 204 depends on the composition of the sacrificial material 204.

In some cases, in addition to the roughened surface 102, the SiC substrate 100 may also have a region of poor crystalline quality at or near the roughened surface 102. For example, standard processes which yield a SiC wafer from a SiC crystal, such as splitting/cleaving, grinding and sawing, can cause microfractures and other damage near the processed surface of the SiC wafer.

Figure 3B:
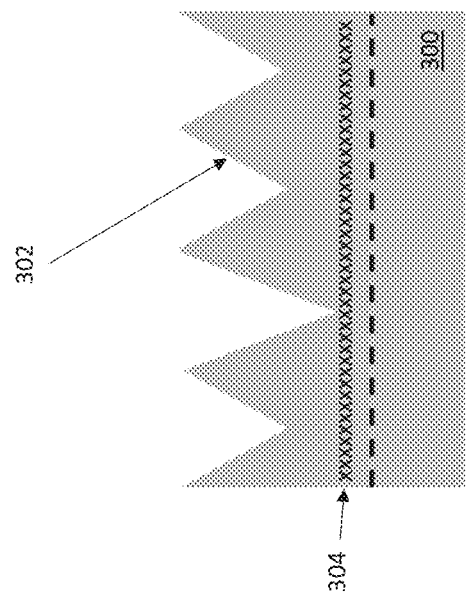
FIGS. 3A and 3B illustrate an embodiment of a dry etching process for ensuring removal of a region of poor crystalline quality at or near the roughened surface of the SiC substrate.
Figure 3A:
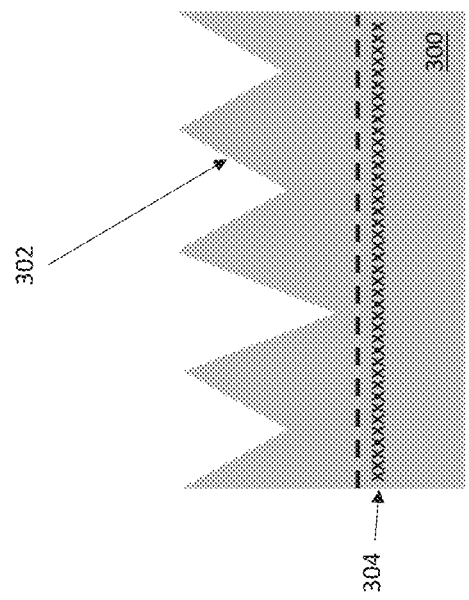

FIG. 3A illustrates a SiC substrate 300 having a roughened surface 302 and a region 304 of poor crystalline quality. The region 304 of poor crystalline quality extends below the dashed line in FIG. 3A, which indicates the bottom of the amorphous region to be subsequently produced by the planarization process described above in connection with FIGS. 1A through 1E and FIGS. 2A through 2D.

FIG. 3B shows the SiC substrate 300 after a standard dry etch process such as a plasma etch. The topography of the roughened surface 302 is transferred deeper into the SiC substrate 300 by the dry etch process, so that the region 304 of poor crystalline quality is above the dashed line. This means that the region 304 of poor crystalline quality will be disposed in the amorphous region subsequently produced by the planarization process described above in connection with FIGS. 1A through 1E and FIGS. 2A through 2D. The wet etching-based planarization process described above is then performed, to planarize the roughened surface 302 of the SiC substrate 300. Since the roughened surface 302 of the SiC substrate 300 was transferred deeper in the SiC substrate 300 by the prior dry etching process as shown in FIG. 3B, the region 304 of poor crystalline quality is disposed within the amorphous region removed by the wet chemical etching process described above.

In still another embodiment, the SiC substrate 300 is planarized by a standard dry etching process after the roughened surface 302 is planarized as previously described herein in connection with FIGS. 1A through 1E and FIGS. 2A through 2D. With this approach, the roughened surface 302 has been planarized but the region 304 of poor crystalline quality is still present at or near the planarized surface 302. A subsequent dry etching process transfers the planarized surface 302 deeper into the SiC substrate 300 while removing the region 304 of poor crystalline quality. As such, the roughened surface 302 of the SiC substrate 300 can be dry etched before forming the sacrificial material on the roughened surface or after removing the sacrificial material and the amorphous region of the SiC by wet etching, to remove a region 304 of poor crystalline quality.

Figure 4B:
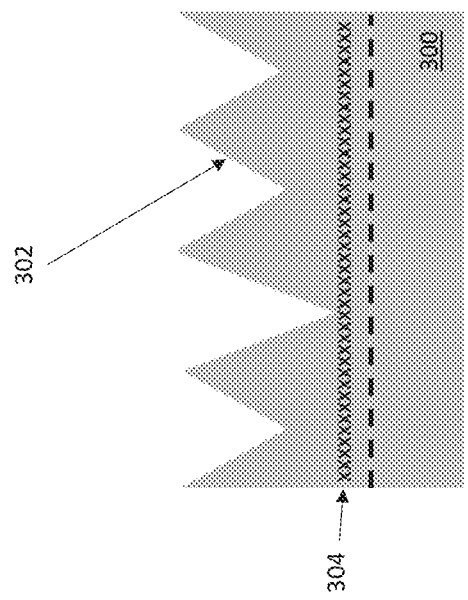
FIGS. 4A and 4B illustrate an embodiment of a wet etching process for ensuring removal of a region of poor crystalline quality at or near the roughened surface of the SiC substrate.
Figure 4A:
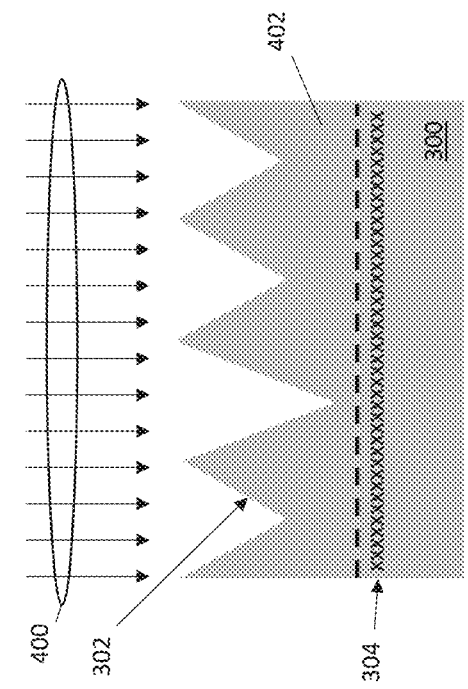

FIGS. 4A and 4B illustrate an alternative approach, in which ion implantation and wet chemical etching processes are used to transfer the roughened surface 302 of the SiC substrate 300 deeper in the SiC substrate 300 before planarizing the roughened surface 302. As previously explained herein, amorphous SiC can be removed via a wet etch process. By implanting an amorphous concentration of ions 400 into the roughened surface 302 of the SiC substrate 300 as shown in FIG. 4A, the roughened surface 302 can be amorphized before the sacrificial material is formed on the roughened surface 302. The topography of the roughened surface 302 is transferred deeper into the SiC substrate 300 by wet chemically etching the amorphized region 402 of the SiC as shown in FIG. 4B, so that the region 304 of poor crystalline quality is transferred above the dashed line. As explained above, this means that the region 304 of poor crystalline quality will be disposed in the amorphous region to be produced by the subsequent planarization process so that the region 304 of poor crystalline quality is removed by the wet chemical etching process performed as part of the planarization process.

FIGS. 5A and 5B illustrate yet another alternative approach, in which the region 304 of poor crystalline quality is removed after the roughened surface 302 of the SiC substrate 300 is planarized. According to this embodiment, ions 500 are implanted directly into the planarized surface 502 of the SiC substrate 300 to form a new amorphous region 504 in the SiC substrate 300 as shown in FIG. 5A. FIG. 5B shows the SiC substrate 300 after the new amorphous region 504 is removed by wet etching.

FIGS. 6A through 6E illustrate an embodiment in which the roughened surface 602 of a SiC substrate 600 is partly planarized before forming a sacrificial material on the roughened surface 602.

Figure 6C:
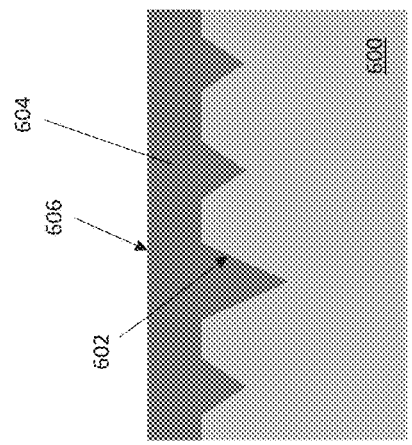
Figure 6B:
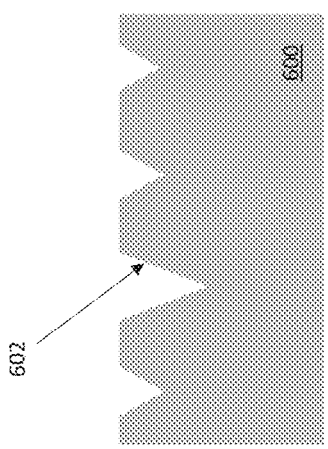
Figure 6A:
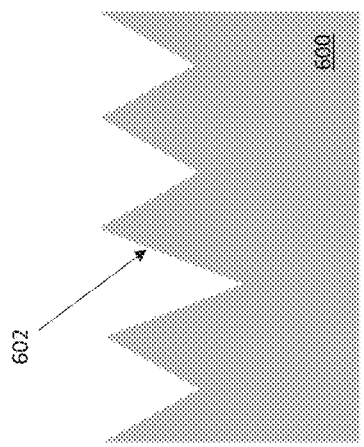

FIG. 6A shows part of the SiC substrate 600 with the roughened surface 602 prior to partial planarization.

FIG. 6B shows the SiC substrate 600 after the roughened surface 602 is partly planarized. Any standard SiC planarization process can be used to partly planarize the roughened surface 602, such as but not limited to mechanical polishing, CMP, etc. In one embodiment, the roughened surface 602 of the SiC substrate 600 has an average peak-to-valley distance in a range between 5 microns and 15 microns before being partly planarized and an average peak-to-valley distance in a range between 1 micron and 5 microns or between 0.3 micron and 1.5 microns after being partly planarized and before forming the sacrificial material on the roughened surface 602.

FIG. 6C shows the SiC substrate 602 after a sacrificial material 604 is formed on the partly planarized roughened surface 602 of the SiC substrate 600. The sacrificial material 604 has a density between 35% and 120% of the density of the SiC substrate 600, and may be planarized depending on the planarity of the top surface 606 of the sacrificial material 604 as previously described herein. For some types of compositions such as spin-on-glass and other spin-on materials, the optional planarization step can be skipped.

FIG. 6D shows the SiC substrate 600 as ions 608 are being implanted through the sacrificial material 604 and into the partly planarized roughened surface 602 of the SiC substrate 600 to form an amorphous region 610 in the SiC substrate 600. The dashed line in FIG. 6C indicates the bottom of the amorphous region 610.

FIG. 6E shows the SiC substrate 600 after the sacrificial material 604 and the amorphous region 610 of the SiC substrate 600 are removed by wet etching, yielding a planarized top surface 612. The sacrificial material 604 and the amorphous region 610 can be removed using the same or different etching solutions as previously explained herein.

The ion implantation processes previously described herein can be performed at an angle with respect to the SiC substrate being implanted.

Figure 7:
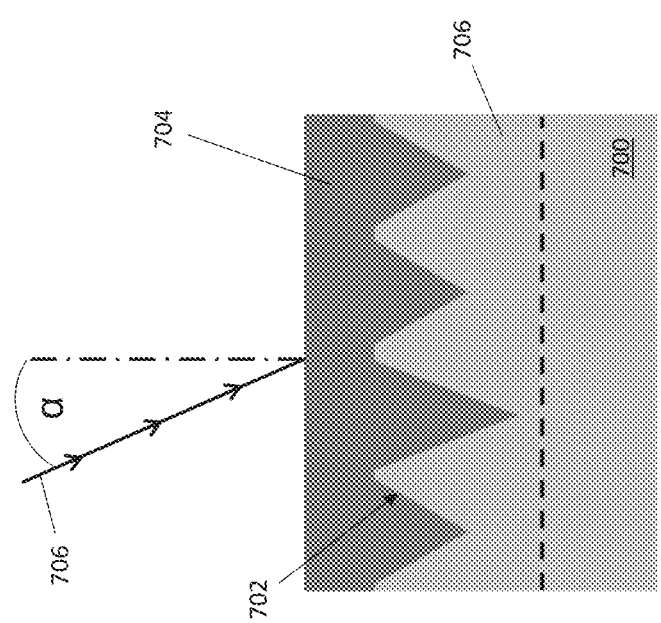
FIG. 7 illustrates an embodiment of a titled ion beam implantation process used to form an amorphous region at the roughened surface of the SiC substrate, which is subsequently removed by wet chemical etching.

FIG. 7 illustrates an embodiment in which a SiC substrate 700 has a roughened surface 702 and ions are implanted through a sacrificial material 704 and into the roughened surface 702 to form an amorphous region 706, by generating an ion beam 706 directed towards the sacrificial material 704. The sacrificial material 704 has a density between 35% and 120% of the density of the SiC substrate 700 as previously described herein. The ion bean 706 is schematically illustrated in FIG. 7, and can be generated using any standard ion implantation equipment suited for SiC technology. The ion beam 706 is titled at an angle α between 1 degree and 10 degrees with respect to a direction perpendicular to the SiC substrate 700. With this embodiment, the ion implantation angle α is tilted against the main crystallographic hexagonal direction of the SiC substrate 700. A channelling effect may occur at the tips (peaks) of the roughened surface 702 of the SiC substrate 700 during the ion implantation process, where inverse spikes cause the channelling. By tilting the ion beam 706 between 1 and 10 degrees, e.g. about 7 degrees typically with respect to a direction perpendicular to the SiC substrate 700, the channelling effect can be reduced. Tilting the ion beam 700 more than 10 degrees may limit implantation depth without meaningfully reducing the channelling effect further.

FIG. 8 illustrates another embodiment in which after planarizing the sacrificial material 108, some of the peaks 104 of the roughened SiC surface 102 may no longer be covered by the sacrificial material 108. In this case, only the valleys 106 of the roughened SiC surface 102 remain filled with the sacrificial material 108 as indicated by the dashed line in FIG. 8. This case may arise, e.g., when using CMP to planarize the sacrificial material 108 and the CMP process is stopped on the roughened SiC surface 102. In this case, a planarization effect is achieved but it is reduced compared to the case of complete coverage of the roughened SiC surface 102 by the sacrificial material 108 as indicated by the solid line with peaks in FIG. 8.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of planarizing a roughened surface of a SiC substrate, the method comprising:
   forming a sacrificial material on the roughened surface of the SiC substrate, the sacrificial material having a density between 35% and 120% of the density of the SiC substrate;
   implanting ions through the sacrificial material and into the roughened surface of the SiC substrate to form an amorphous region in the SiC substrate; and
   removing the sacrificial material and the amorphous region of the SiC substrate by wet etching.

2. The method of claim 1, wherein the surface of the SiC substrate has remaining roughness after the sacrificial material and the amorphous region of the SiC substrate are removed by wet etching, the method further comprising:
   forming an additional sacrificial material on the surface of the SiC substrate with the remaining roughness, the additional sacrificial material having a density between 35% and 120% of the density of the SiC substrate;
   implanting ions through the additional sacrificial material and into the surface of the SiC substrate with the remaining roughness to form an additional amorphous region in the SiC substrate; and
   removing the additional sacrificial material and the additional amorphous region of the SiC substrate by wet etching.

3. The method of claim 1, wherein implanting ions through the sacrificial material and into the roughened surface of the SiC substrate to form the amorphous region comprises:
   generating an ion beam directed towards the sacrificial material; and
   tilting the ion beam at an angle between 1 degree and 10 degrees with respect to a direction perpendicular to the SiC substrate.

4. The method of claim 1, wherein the sacrificial material comprises at least one of a polymer, an anti-reflective coating, a photoresist, spin-on-glass and a high-density-plasma chemical vapour deposited (HDP-CVD) oxide.

5. The method of claim 1, further comprising:
   planarizing the sacrificial material before implanting the ions.

6. The method of claim 1, wherein the ions are electrically active in the SiC substrate.

7. The method of claim 6, wherein some of the ions remain in the SiC substrate after removal of the amorphous region to form an electrically conductive region at a planarized surface of the SiC substrate formed by removal of the amorphous region.

8. The method of claim 1, wherein the ions are electrically inactive in the SiC substrate.

9. The method of claim 1, wherein the ions are selected from the group consisting of aluminum, argon, arsenic, nitrogen, oxygen, phosphorous, boron, silicon, carbon and germanium.

10. The method of claim 1, wherein the roughened surface of the SiC substrate has a maximum peak-to-valley distance, and wherein the ions are implanted at an energy level selected so that the amorphous region extends deeper in the SiC substrate than the maximum peak-to-valley distance.

11. The method of claim 1, wherein removing the amorphous region of the SiC substrate by wet etching comprises etching the SiC substrate in a solution of hydrofluoric acid, nitric acid, tetramethylammonium hydroxide or potassium hydroxide.

12. The method of claim 1, further comprising:
dry etching the roughened surface of the SiC substrate before forming the sacrificial material on the roughened surface.

13. The method of claim 1, further comprising:
dry etching the surface of the SiC substrate after removing the sacrificial material and the amorphous region of the SiC substrate by wet etching.

14. The method of claim 1, further comprising:
implanting ions directly into the roughened surface of the SiC substrate to form an additional amorphous region in the SiC substrate before forming the sacrificial material on the roughened surface; and
removing the additional amorphous region by wet etching before forming the sacrificial material on the roughened surface.

15. The method of claim 1, further comprising:
implanting ions directly into the surface of the SiC substrate to form an additional amorphous region in the SiC substrate after removing the sacrificial material and the amorphous region of the SiC substrate by wet etching; and
removing the additional amorphous region of the SiC substrate by wet etching.

16. The method of claim 1, further comprising:
partly planarizing the roughened surface of the SiC substrate before forming the sacrificial material on the roughened surface.

17. The method of claim 16, wherein the roughened surface of the SiC substrate has an average peak-to-valley distance in a range between 5 microns and 15 microns before being partly planarized, and wherein the roughened surface of the SiC substrate has an average peak-to-valley distance in a range between 1 micron and 5 microns or between 0.3 micron and 1.5 microns after being partly planarized and before forming the sacrificial material on the roughened surface.

18. The method of claim 1, wherein the sacrificial material and the amorphous region of the SiC are removed by different etching solutions.

19. The method of claim 1, further comprising:
splitting a SiC wafer to form the SiC substrate, wherein the roughened surface of the SiC substrate results from the splitting.

20. The method of claim 1, further comprising:
thinning a SiC wafer to form the SiC substrate, wherein the roughened surface of the SiC substrate results from the thinning.

21. The method of claim 1, further comprising:
sawing a SiC boule to form the SiC substrate, wherein the roughened surface of the SiC substrate results from the sawing.

* * * * *